(12) United States Patent
Shimizu et al.

(10) Patent No.: US 11,443,891 B2
(45) Date of Patent: Sep. 13, 2022

(54) COIL COMPONENT AND ELECTRONIC DEVICE

(71) Applicant: TAIYO YUDEN CO., LTD., Tokyo (JP)

(72) Inventors: Makoto Shimizu, Takasaki (JP); Tomoo Kashiwa, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 486 days.

(21) Appl. No.: 16/654,989

(22) Filed: Oct. 16, 2019

(65) Prior Publication Data

US 2020/0135385 A1 Apr. 30, 2020

(30) Foreign Application Priority Data

Oct. 30, 2018 (JP) .............................. JP2018-204288

(51) Int. Cl.
*H05K 1/18* (2006.01)
*H01F 27/29* (2006.01)
(Continued)

(52) U.S. Cl.
CPC ........... *H01F 27/292* (2013.01); *H01F 27/06* (2013.01); *H01F 27/24* (2013.01);
(Continued)

(58) Field of Classification Search
CPC ............ H05K 1/181; H05K 2201/1003; H01F 27/24; H01F 27/2828
See application file for complete search history.

(56) References Cited

U.S. PATENT DOCUMENTS 3,585,553 A * 6/1971 Muckelroy ............... H01F 5/04
336/208
5,719,547 A * 2/1998 Kaneko ................... H01F 27/29
336/183
(Continued)

FOREIGN PATENT DOCUMENTS

JP H02110309 U 9/1990
JP 2007165539 A 6/2007
(Continued)

OTHER PUBLICATIONS

A Notice of Reasons for Refusal issued by the Japanese Patent Office, dated Jun. 21, 2022, for Japanese counterpart application No. 2018-204288. (3 pages).

*Primary Examiner* — Sherman Ng
(74) *Attorney, Agent, or Firm* — Law Office of Katsuhiro Arai

(57) ABSTRACT

A coil component includes: a core part including: a winding shaft; and a flange part provided on an axial-direction end of the winding shaft, which has an exterior face on the opposite side of the winding shaft, first and second side faces, and first and second groove parts provided on the exterior face and having a cut-out part on each the first and second side faces; a coil part including: a winding part of a conductor wound around the winding shaft; and two lead parts of the conductor led out from the winding part; and two terminal parts formed on the exterior face of the flange part; wherein the two lead parts are led in from the cut-out parts on the first and second side faces and fitted inside the groove parts, respectively, on the exterior face, and included in the pair of terminal parts, respectively.

7 Claims, 14 Drawing Sheets

(51) Int. Cl.
*H01F 27/24* (2006.01)
*H01F 27/28* (2006.01)
*H01F 27/06* (2006.01)

(52) U.S. Cl.
CPC ......... *H01F 27/2823* (2013.01); *H05K 1/181* (2013.01); *H01F 2027/065* (2013.01); *H05K 2201/1003* (2013.01)

(56) References Cited

U.S. PATENT DOCUMENTS

| | | | | |
|---|---|---|---|---|
| 6,144,280 | A * | 11/2000 | Amada | H01F 17/045 336/205 |
| 6,157,283 | A * | 12/2000 | Tsunemi | H01F 27/292 336/200 |
| 6,392,523 | B1 * | 5/2002 | Tsunemi | H01F 17/045 336/200 |
| 7,414,509 | B2 * | 8/2008 | Yagi | H01F 27/027 336/200 |
| 2007/0188281 | A1 | 8/2007 | Iguchi et al. | |
| 2017/0092411 | A1 | 3/2017 | Shimizu et al. | |

FOREIGN PATENT DOCUMENTS

| | | |
|---|---|---|
| JP | 2007214521 A | 8/2007 |
| JP | 2017069391 A | 4/2017 |

* cited by examiner

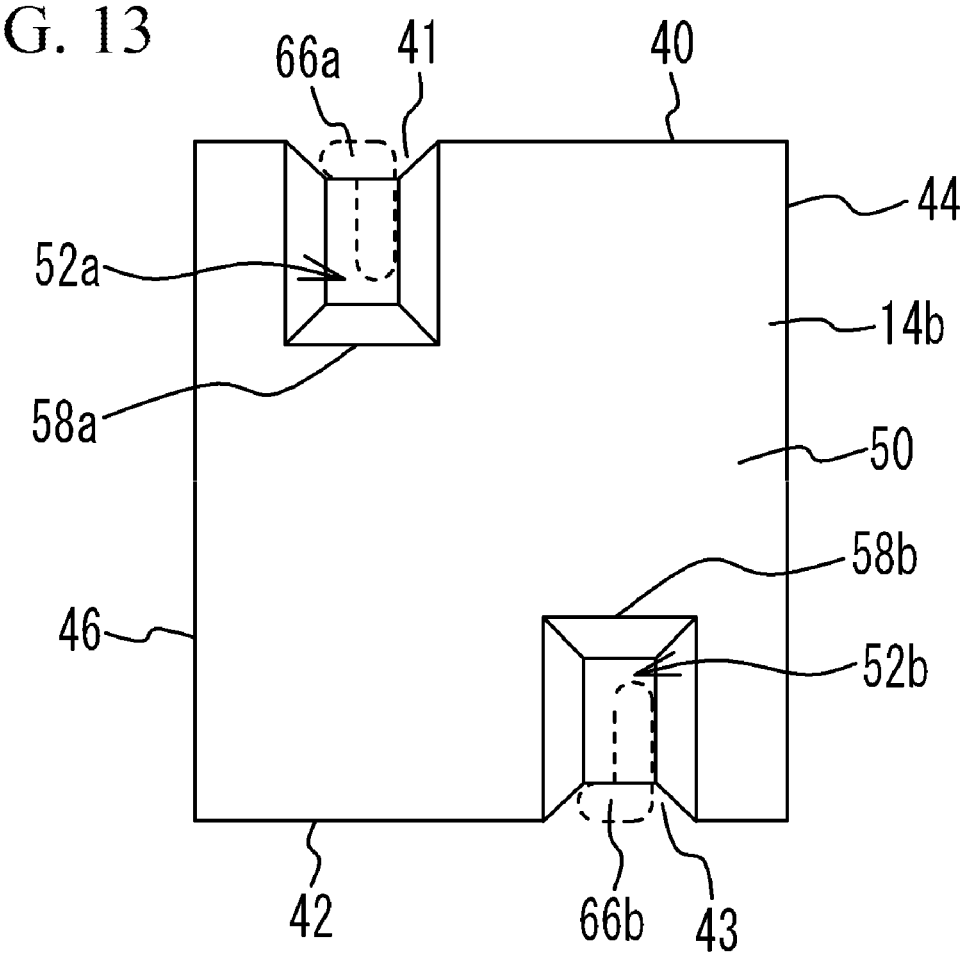

COIL COMPONENT AND ELECTRONIC DEVICE

CROSS-REFERENCE TO RELATED APPLICATIONS

The present application claims priority to Japanese Patent Application No. 2018-204288, filed Oct. 30, 2018, the disclosure of which is incorporated herein by reference in its entirety including any and all particular combinations of the features disclosed therein.

BACKGROUND

Field of the Invention

The present invention relates to a coil component and an electronic device.

Description of the Related Art

Coil components, comprising a conductor wound around the winding shaft of a drum core, with the end portions of the conductor led out to the exterior face of a flange part of the drum core on the opposite side of the winding shaft, are known. For example, known as a way to connect the end portions of the conductor that have been led out to the exterior face of the flange part, to a metal film provided on the exterior face of the flange part, is to flatten the end portions of the conductor (refer to Patent Literature 1, for example). For example, an art of leading out the end portions of the conductor into a groove part provided on the exterior face of the flange part and then solder-connecting the end portions of the conductor to a metal film provided in the groove, is known (refer to Patent Literature 2, for example).

BACKGROUND ART LITERATURES

[Patent Literature 1] Japanese Patent Laid-open No. 2007-165539

[Patent Literature 2] Japanese Patent Laid-open No. 2007-214521

SUMMARY

The present invention is a coil component comprising: a core part, including: a winding shaft; and a flange part provided on an axial-direction end of the winding shaft, which has an exterior face on the opposite side of the winding shaft, a pair of a first side face and a second side face that are adjoining the exterior face and facing each other, and a single or multiple groove parts provided on the exterior face and having a cut-out part on at least one of the first side face and second side face; a coil part, including: a winding part constituted by a conductor with an insulating film, which is wound around the winding shaft; and a pair of lead parts that are portions of the conductor led out from the winding part; and a pair of terminal parts formed on the exterior face of the flange part; wherein: one of the pair of lead parts is led in from the cut-out part on the first side face side of the flange part and fitted inside one of the single or multiple groove parts provided on the exterior face, and included in one of the pair of terminal parts; and the other of the pair of lead parts is led in from the cut-out part on the second side face side of the flange part and fitted inside one of the single or multiple groove parts provided on the exterior face, and included in the other of the pair of terminal parts.

The present invention is an electronic device comprising: the aforementioned coil component; and a circuit board on which the coil component has been mounted.

BRIEF DESCRIPTION OF THE DRAWINGS

FIG. 1A is a perspective view of the coil component pertaining to Example 1, while

FIG. 2A is a side view showing through the resin film and solder in FIG. 1B, while

FIG. 3A is a side view, while

FIG. 8A is a drawing showing the position relationship between the winding shaft and the groove part in Example 1, while

FIG. 9A is a side view, while

FIG. 12A is a drawing showing the position relationship between the winding shaft and the groove parts in Example 3, while

FIG. 13 is a drawing showing another example of layout of two groove parts.

DESCRIPTION OF THE SYMBOLS

Figure 1A:
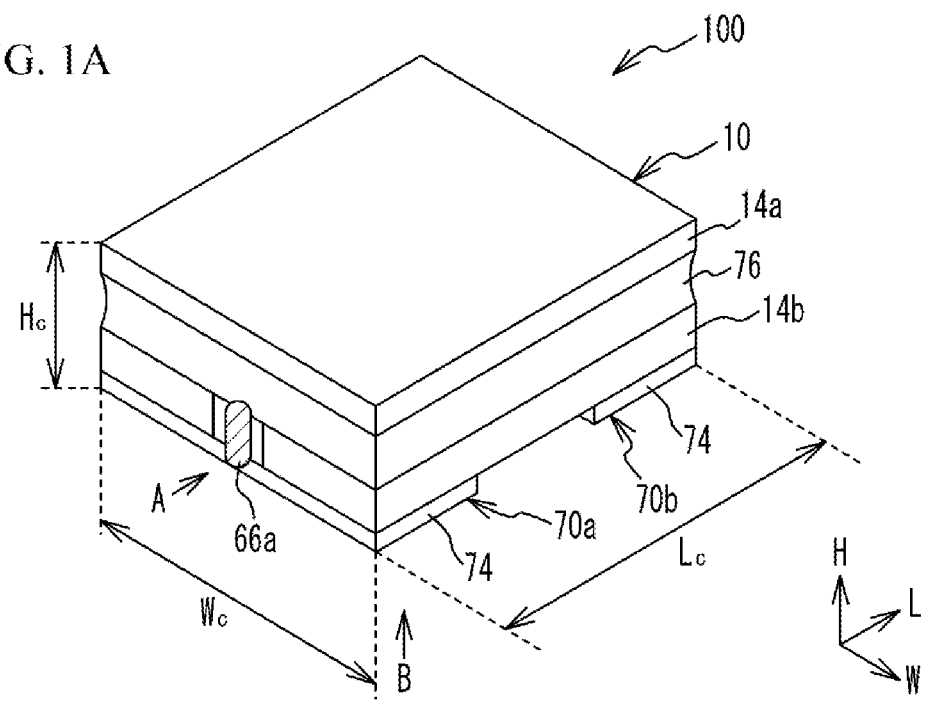

1 Center axis
2 Center
10 Drum core
12 Axis of winding
14a, 14b Flange part
16 Projected area
20, 24, 26 Side face
28 Interior face
30 Exterior face
40, 42, 44, 46 Side face
41 Cut-out part
43 Cut-out part
48 Interior face
50 Exterior face
52, 52a, 52b Groove part
54 Bottom face
56 Beveled face 58a, 58b Tip portion
60 Coil part
62 Conductive wire
64 Winding part
66a, 66b Lead part
70a, 70b Terminal part
72a, 72b Metal film
74 Solder
76 Resin film
80 Circuit board
82 Land pattern electrode
100 Coil component
400 Electronic device

DETAILED DESCRIPTION OF EMBODIMENTS

Examples of the present invention are explained below by referring to the drawings.

Example 1

Figure 1B:
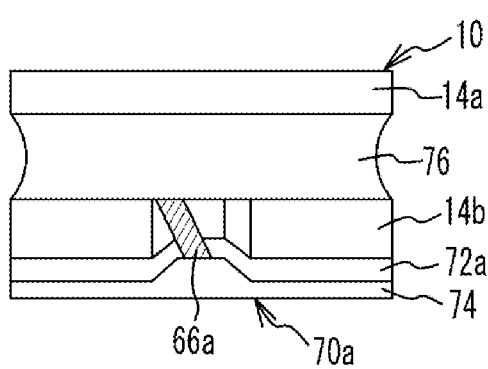
FIG. 1B is a side view of FIG. 1A from the direction of A.
Figure 1C:
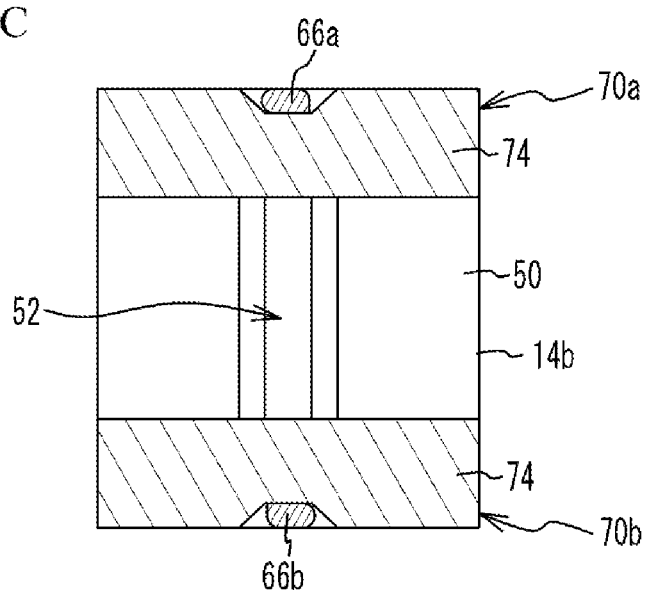
FIG. 1C is a bottom view of FIG. 1A from the direction of B.
Figure 2A:
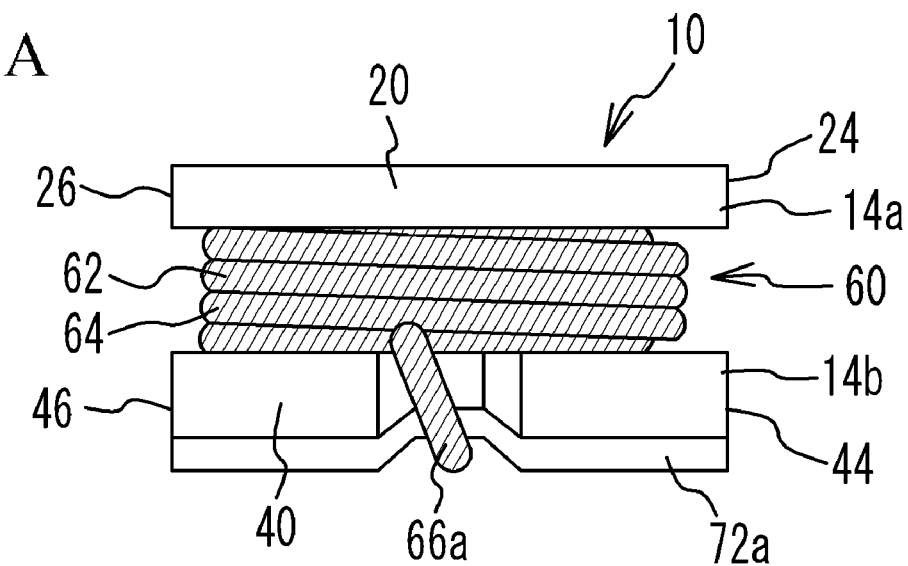
Figure 2B:
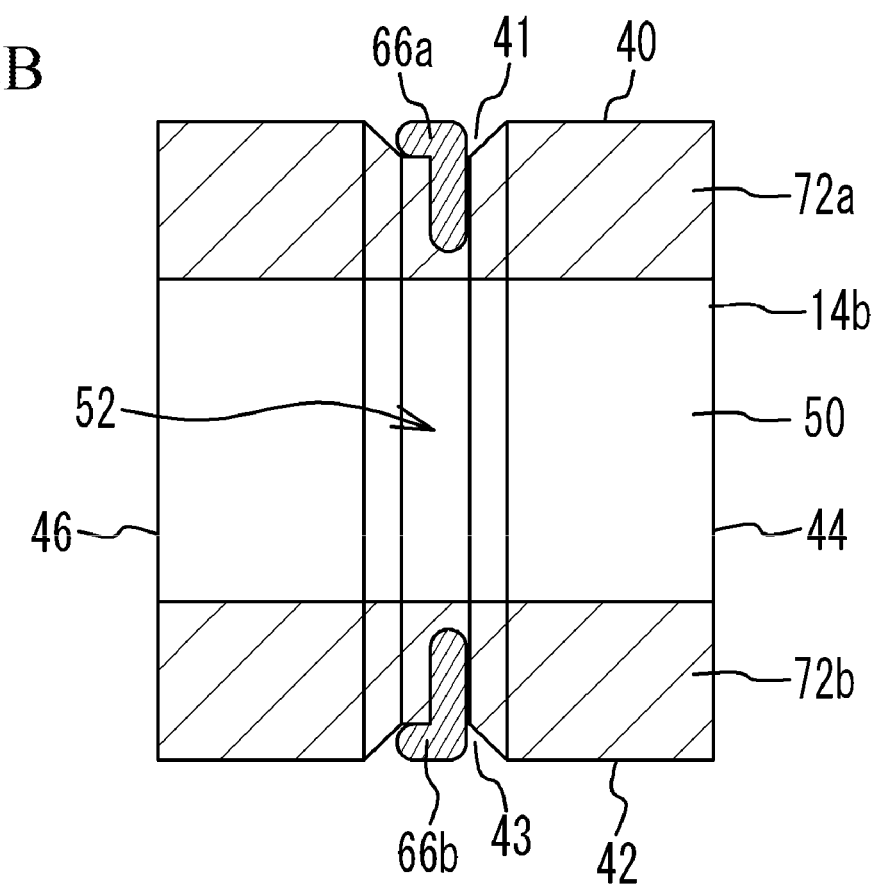
FIG. 2B is a bottom view showing through the solder in FIG. 1C.

FIG. 1A is a perspective view of the coil component pertaining to Example 1, while FIG. 1B is a side view of FIG. 1A from the direction of A, and FIG. 1C is a bottom view of FIG. 1A from the direction of B. FIG. 2A is a side view showing through the resin film and solder in FIG. 1B, while FIG. 2B is a bottom view showing through the solder in FIG. 1C. It should be noted that, for the purpose of illustrative clarity, the coil part 60 is hatched in FIGS. 1A to 1C, 2A, and 2B, while the metal films 72a, 72b and solder 74 are hatched in FIGS. 1C and 2B. As shown in FIGS. 1A to 1C, 2A, and 2B, the coil component 100 in Example 1 comprises a drum core (core part) 10, a coil part 60, and terminal parts 70a, 70b.

Figure 3A:
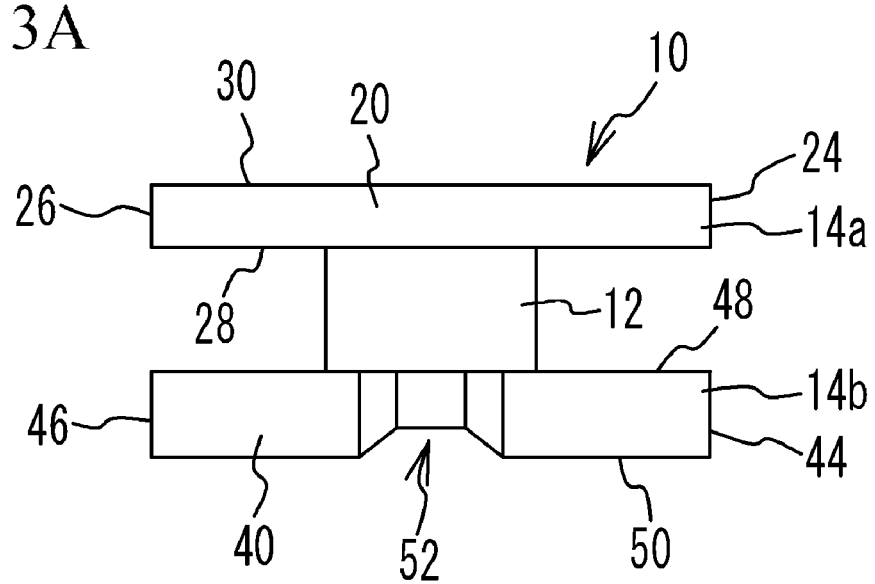
Figure 3B:
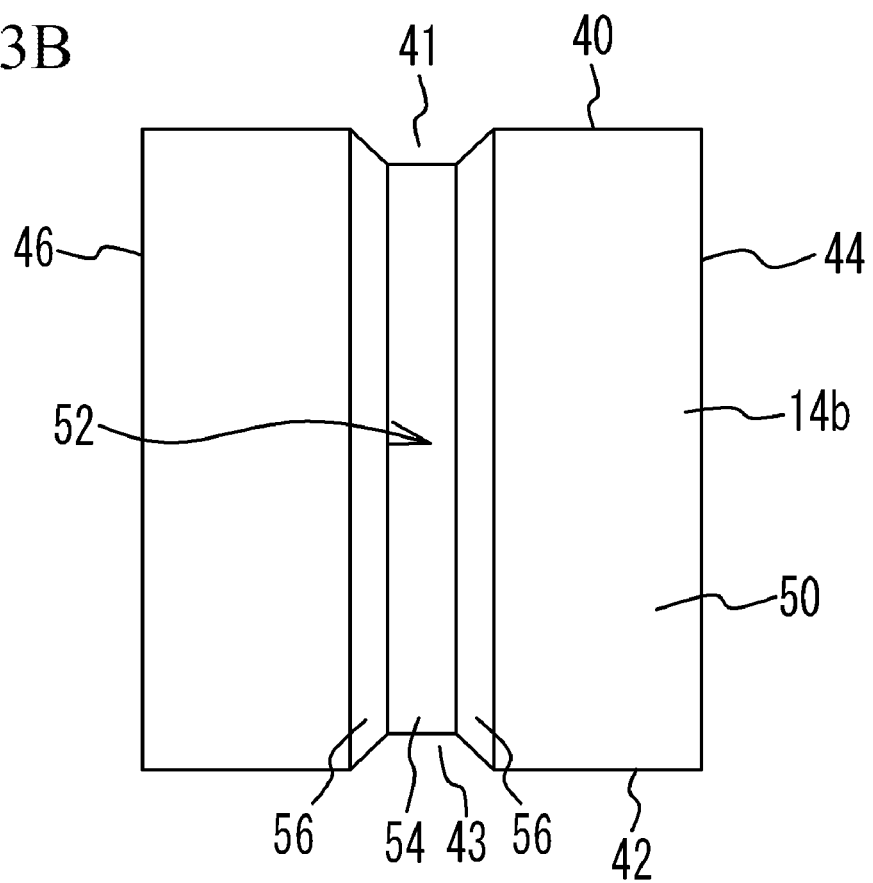
FIG. 3B is a bottom view, showing the drum core in Example 1.

FIG. 3A is a side view, while FIG. 3B is a bottom view, showing the drum core in Example 1. As shown in FIGS. 3A and 3B, the drum core 10 includes a winding shaft 12 and plate-shaped flange parts 14a, 14b provided at both axial-direction ends of the winding shaft 12. The thickness dimension of the flange part 14a is 0.15 mm to 0.3 mm, for example. The thickness dimension of the flange part 14b is 0.175 mm to 0.35 mm, for example. The thickness dimension of the flange part 14b is greater than the thickness dimension of the flange part 14a. The winding shaft 12 has a columnar shape whose bottom face profile is formed by straight lines connecting two arcs, for example. The flange parts 14a, 14b have a rectangular solid shape, for example.

The flange part 14a has four side faces, including a side face 20, a side face (not illustrated in the figure) on the opposite side of the side face 20 across the winding shaft 12, a side face 24 adjoining the side face 20 and side face not illustrated in the figure, and a side face 26 on the opposite side of the side face 24 across the winding shaft 12. Also, the flange part 14a has an interior face 28 to which the winding shaft 12 is connected, and an exterior face 30 on the opposite side of the interior face 28. All of the side faces of the flange part 14a are adjoining the interior face 28 and exterior face 30.

The flange part 14b has four side faces, including a side face 40, a side face 42 on the opposite side of the side face 40 across the winding shaft 12, a side face 44 adjoining the side faces 40, 42, and a side face 46 on the opposite side of the side face 44 across the winding shaft 12. Also, the flange part 14b has an interior face 48 to which the winding shaft 12 is connected, and an exterior face 50 on the opposite side of the interior face 48. All of the side faces 40 to 46 of the flange part 14b are adjoining the interior face 48 and exterior face 50. The exterior face 50 may be rectangular, or it may have long sides and short sides.

The side face 20 of the flange part 14a is roughly flush with the side face 40 of the flange part 14b. The side face of the flange part 14a not illustrated in the figure is roughly flush with the side face 42 of the flange part 14b. The side face 24 of the flange part 14a is roughly flush with the side face 44 of the flange part 14b. The side face 26 of the flange part 14a is roughly flush with the side face 46 of the flange part 14b.

The winding shaft 12 is connected to the interior faces 28, 48 of the flange parts 14a, 14b in such a way that its center axis roughly corresponds to the centers of the interior faces 28, 48, to which the winding shaft 12 is connected, of the flange parts 14a, 14b.

Provided on the exterior face 50 of the flange part 14b is a groove part 52 representing a portion of the face concaved like a groove. The groove part 52 is provided in contact with the side faces 40, 42, has cut-out parts 41, 43 on the side faces 40, 42 and extends linearly between the side faces 40, 42. It should be noted that the side faces 40, 42 may have concaved parts, and the groove part 52 may have cut-out parts 41, 43 in these concaved parts. The groove part 52 extends linearly in a direction roughly orthogonal to the side faces 40, 42. It should be noted that "direction roughly orthogonal" is not limited to the perfectly orthogonal direction, and includes tilting by manufacturing error or so. The groove part 52 extends along one side of the exterior face 50. Based on the shapes of general surface mounting components, desirably the groove part 52 extends along a long side of the exterior face 50; depending on the terminal structure, however, the groove part 52 may also extend along a short side of the exterior face 50. The groove part 52 has a tapered shape whose width decreases toward its bottom face 54. In other words, the groove part 52 has a bottom face 54 and two beveled faces 56 adjoining the bottom face 54 and causing the width of the groove part 52 to decrease toward the bottom face 54. It should be noted that, regarding the shape of the groove part 52, any shape may be used so long as it forms a groove, such as one constituted by a bottom face 54 and side faces orthogonally adjoining the bottom face 54, where the bottom face 54 and/or side faces are not limited to flat surfaces but they may also be curved surfaces.

The depth dimension of the groove part 52 is 0.05 mm to 0.25 mm, for example, and no greater than one-half the thickness dimension of the flange part 14b. The deeper the groove part 52, the thinner the flange part 14b becomes and the mechanical strength drops as a result; accordingly, the depth dimension of the groove part 52 is preferably no greater than one third, or more preferably no greater than one fourth, the thickness dimension of the flange part 14b. The width dimensions of the groove part 52 on the cut-out part side and bottom face side are roughly constant, from one end to the other end, over the length direction of the groove part 52, such as 0.15 mm to 0.75 mm on the cut-out part side, for example, and 0.05 mm to 0.25 mm on the bottom face side, for example.

The drum core 10 is formed in a manner containing a magnetic material. For example, the drum core 10 is formed in a manner containing Ni—Zn, Mn—Zn, or other ferrite material, Fe—Si—Cr, Fe—Si—Al, Fe—Si—Cr—Al, or other soft magnetic alloy material, Fe, Ni, or other magnetic metal material, amorphous magnetic metal material, or nanocrystal magnetic metal material. If it is to be formed using a ferrite material, the drum core 10 may be formed by sintering the ferrite material. In this case, the drum core 10 has become denser due to the sintering reaction. If it is to be formed using metal magnetic grains, the drum core 10 may be formed by solidifying the metal magnetic grains with a resin, or by causing the insulating films formed on the surfaces of the metal magnetic grains to bond together. In this case, the magnetic grains of the drum core 10 are bonded by the resin or insulating films, which means that the shapes of the magnetic grains are roughly maintained.

As shown in FIGS. 2A and 2B, the coil component 60 includes a winding part 64 constituted by winding a conductive wire 62 comprising a metal covered with an insulating film, and lead parts 66a, 66b which are portions of the conductive wire 62 led out from the winding part 64. The conductive wire 62 has a diameter of 0.04 mm or more, for example. The metal covered with the insulating film is copper, silver, palladium, silver-palladium alloy, etc., for example. The insulating film is polyester imide, polyamide, etc., for example.

The lead part 66a is bent along the side face 40 of the flange part 14b, after which it is bent further along the exterior face 50 of the flange part 14b and led into the groove part 52 provided on the exterior face 50 of the flange part 14b from the cut-out part 41 of the groove part 52 on the side face 40 side. The lead part 66b is bent along the side face 42 of the flange part 14b, after which it is bent further along the exterior face 50 of the flange part 14b and led into the groove part 52 provided on the exterior face 50 of the flange part 14b from the cut-out part 43 of the groove part 52 on the side face 42 side. Preferably the depth dimension of the groove part 52 is greater than the diameter of the conductive wire 62 so that the conductive wire 62 fits in the groove part 52. The width dimension of the groove part 52 on the bottom face side is preferably greater than 1.0 time, or more preferably greater than 1.2 times, or yet more preferably greater than 1.4 times, the diameter of the conductive wire 62.

On the exterior face 50 of the flange part 14b, a metal film 72a is provided in a manner aligned to the side face 40 side, while a metal film 72b is provided in a manner aligned to the side face 42 side. The metal films 72a, 72b are away from each other. The metal films 72a, 72b are also provided in the groove part 52 on the side face 40 side and side face 42 side. The metal films 72a, 72b are each formed by laminated metal layers that include, for example, a base layer of copper, silver, palladium, silver-palladium alloy, etc., and a plating layer consisting of nickel and tin layers provided on top.

As shown in FIGS. 1A to 1C, the lead parts 66a, 66b are such that, at their end portion led into the groove part 52, the insulating film is stripped and the metal constituting the conductive wire 62 is exposed, and this exposed metal is joined to the metal films 72a or 72b by a solder 74. This way, terminal parts 70a, 70b are formed. In other words, the terminal parts 70a, 70b are formed by the end portions of the lead parts 66a, 66b, the metal films 72a, 72b, and the solder 74, respectively. The solder 74 is provided in a manner covering a part or all of the surfaces of the metal films 72a, 72b, but it does not bleed out of the metal films 72a, 72b. Desirably the groove part 52 extends along a long side of the exterior face 50, in which case shorting between the terminal parts 70a, 70b can be prevented by increasing the distance between them. It should be noted further that, in this case, the dimensions of the lead parts 66a, 66b that are joined to the terminal parts 70a, 70b, respectively, can be made longer so as to increase the joining strength. It should also be noted further that, in this case, detachment of either of the lead parts 66a, 66b from the terminal part 70a or 70b during mounting does not easily cause shorting because they are positioned in a manner opposing each other, and consequently a failure can be prevented. Shorting between the terminal parts 70a, 70b can also be prevented by applying or filling a solder resist agent, or applying or filling glass, heat-resistant resin, heat-resistant paint, etc., on or in those portions inside the groove part 52 where the terminals 70a, 70b are not formed. Similar effects can also be obtained by applying or filling a solder resist agent, or applying or filling glass, heat-resistant resin, heat-resistant paint, etc., on or in those portions where the terminal parts 70a, 70b are not formed on the exterior face 50, not just in the groove part 52.

A resin film 76 is provided between the flange parts 14a, 14b in a manner covering the winding part 64 of the coil part 60. To make the component smaller, preferably the resin film 76 fits between the flange parts 14a, 14b and does not project out of the flange parts 14a, 14b. The resin film 76 is formed by a resin containing ferrite grains or metal magnetic grains (such as an epoxy resin or other insulating resin). It should be noted that the resin film 76 may not be provided.

When the axial direction of the core is defined as the H direction, the long-side direction of the exterior face of the flange is defined as the L direction, and the short-side direction of the exterior face of the flange is defined as the W direction, the external dimensions of the coil component can be expressed by H-direction dimension Hc, L-direction dimension Lc and W-direction dimension Wc. Also, the external dimensions of the drum core 10 can be expressed by H-direction dimension Hd, L-direction dimension Ld and W-direction dimension Wd (refer to FIGS. 4A and 4B). The height Hc of the coil component 100 is 0.8 mm or less, for example, while its length Lc is approx. 1.2 mm to 2.5 mm, for example, and its width Wc is approx. 0.8 mm to 2.0 mm, for example. The height Hc, length Lc, and width Wc have the relationship of Lc≥Wc>Hc. Also, the percentage of the thickness of the conductive wire 62 to the height He of the coil component 100 may be set to 10% or greater.

Figure 4A:
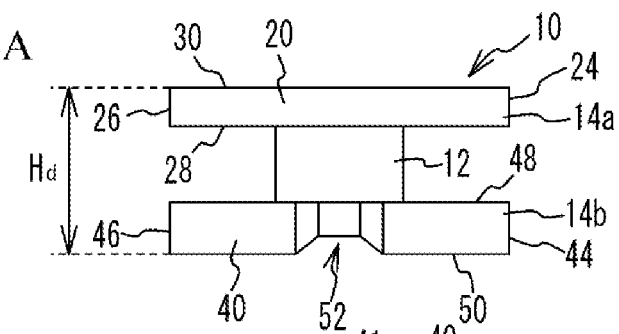
FIGS. 4A to 4D are drawings (part 1) showing how the coil component pertaining to Example 1 is manufactured.
Figure 4B:
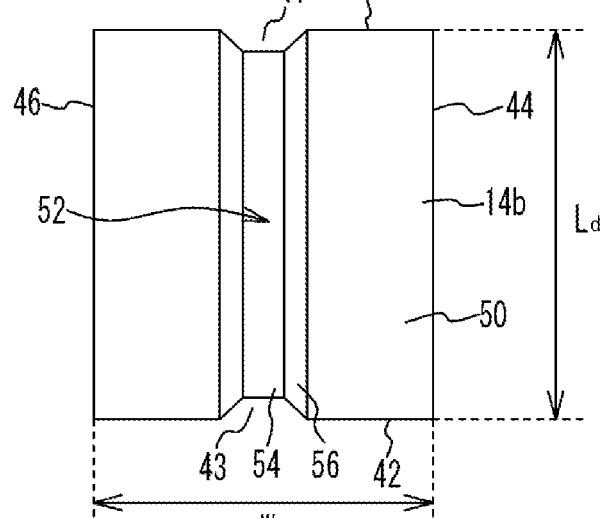

FIGS. 4A to 6B are drawings showing how the coil component pertaining to Example 1 is manufactured. As shown in FIGS. 4A and 4B, a drum core 10 having a winding shaft 12 and flange parts 14a, 14b provided at both ends of the winding shaft 12 is formed by, for example, filling in a die a composite magnetic material prepared by mixing magnetic grains and a resin and then compression-molding the material. A groove part 52 is formed on the exterior face 50 of the flange part 14b. It should be noted that the groove part 52 may be formed by a grinding process after the molding. The height Hd, length Ld, and width Wd of the drum core 10 have the relationship of Ld≥Wd>Hd.

Figure 4C:
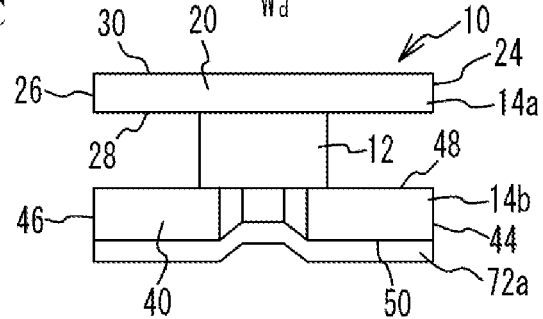
Figure 4D:
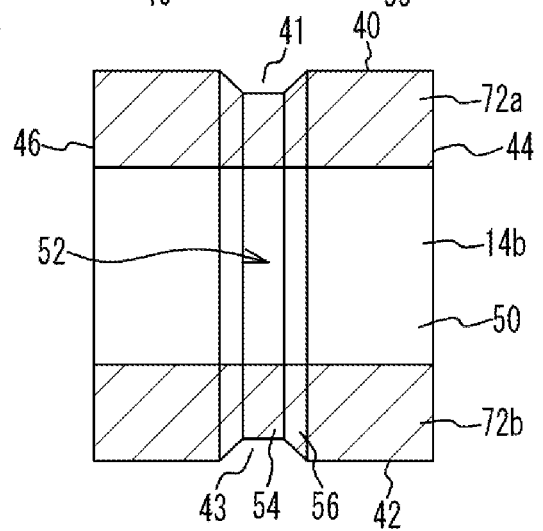

As shown in FIGS. 4C and 4D, metal films 72a, 72b are each formed on the exterior face 50 of the flange part 14b by, for example, forming a base layer using the sputtering method and then forming a plating layer on top of the base layer using a plating method. It should be noted that the base layer may be formed by applying a conductive paste. The metal film 72a is formed on the exterior face 50, in a manner aligned to the side face 40 side, of the flange part 14b, while the metal film 72b is formed on the exterior face 50, in a manner aligned to the side face 42 side, of the flange part 14b. The metal films 72a, 72b are also formed in the groove part 52 on the side face 40 side and side face 42 side.

Figure 5A:
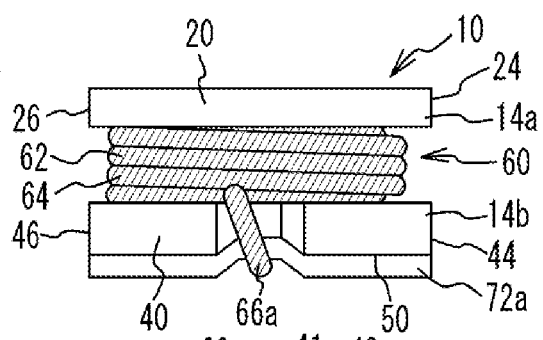
FIGS. 5A to 5D are drawings (part 2) showing how the coil component pertaining to Example 1 is manufactured.
Figure 5B:
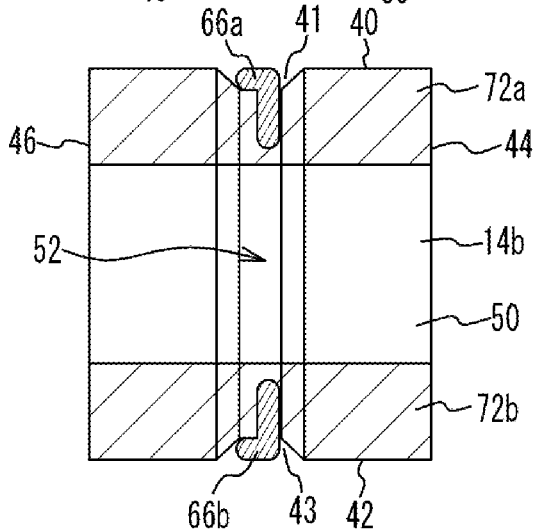

As shown in FIGS. 5A and 5B, a conductive wire 62 is wound around the winding shaft 12 of the drum core 10, and also both end portions of the conductive wire 62 are bent, to form a coil part 60 that includes a winding part 64 being wound around the winding shaft 12, and lead parts 66a, 66b being led out from the winding part 64 into the groove part 52 of the flange part 14b. The lead part 66a is led into the groove part 52 provided on the exterior face 50, from the side face 40 side of the flange part 14b, through the cut-out part 41 of the groove part 52 on the side face 40 side. The lead part 66b is led into the groove part 52 provided on the exterior face 50, from the side face 42 side of the flange part 14b, through the cut-out part 43 of the groove part 52 on the side face 42 side. It should be noted that the coil part 60 may be provided separately and assembled with the drum core 10, prior to the bending process.

Figure 5C:
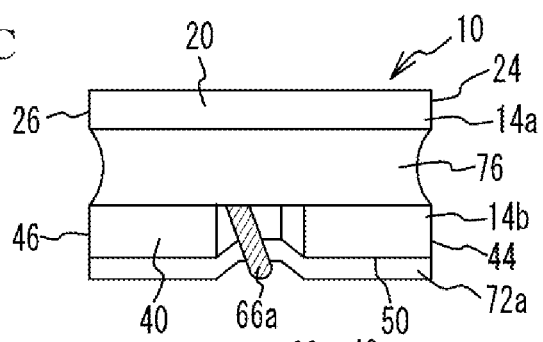
Figure 5D:
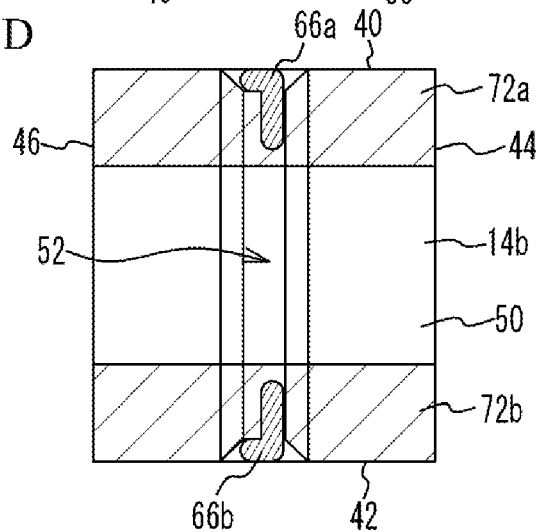

As shown in FIGS. 5C and 5D, a composite magnetic material prepared by mixing magnetic grains and a resin is applied to the exterior side of the winding part 64 between the flange parts 14a, 14b, and then cured, to form a resin film 76. The resin film 76 may be adjusted to have a higher percentage of resin than the drum core 10, to lower the magnetic permeability. In this case, too, magnetic shield property can be ensured.

Figure 6A:
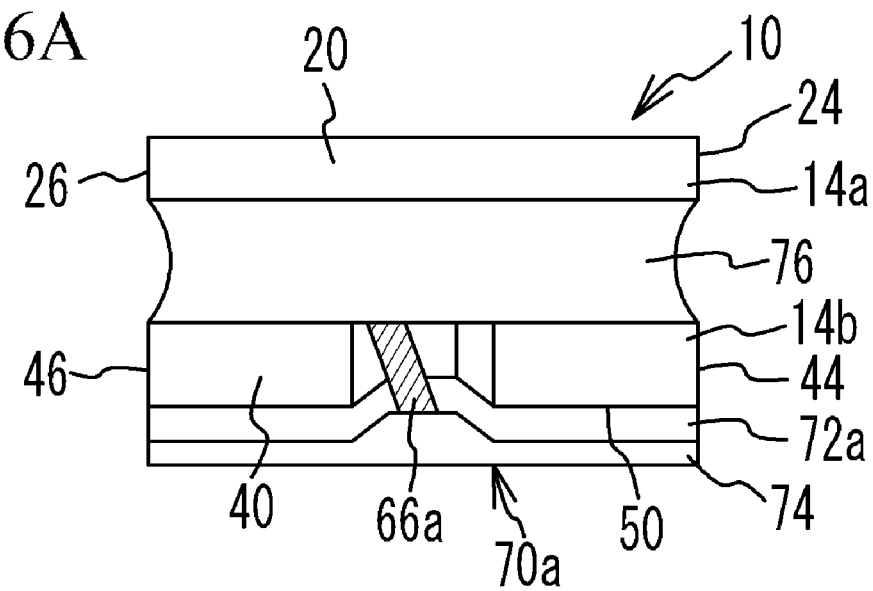
FIGS. 6A and 6B are drawings (part 3) showing how the coil component pertaining to Example 1 is manufactured.
Figure 6B:
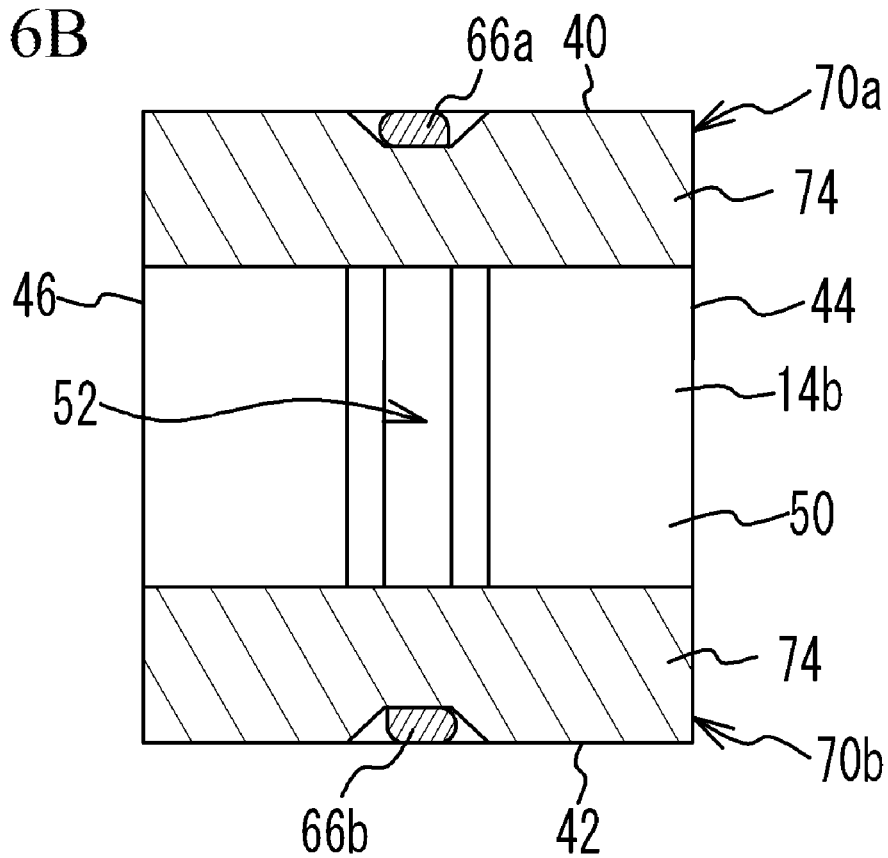

As shown in FIGS. 6A and 6B, a flux is applied to the end portions of the lead parts 66a, 66b that are positioned in the groove part 52, after which the end portions of the lead parts 66a, 66b are heated together with a solder. This way, the insulating film is stripped by the action of the flux and the metal constituting the conductive wire 62 is exposed, and the resulting exposed metal portions are joined to the metal films 72a, 72b with the solder 74. This way, terminal parts 70a, 70b are formed. It should be noted that the terminal parts 70a, 70b may be formed by thermally joining, and thus electrically connecting, the end portions of the lead parts 66a, 66b and the metal films 72a, 72b.

Figure 7:
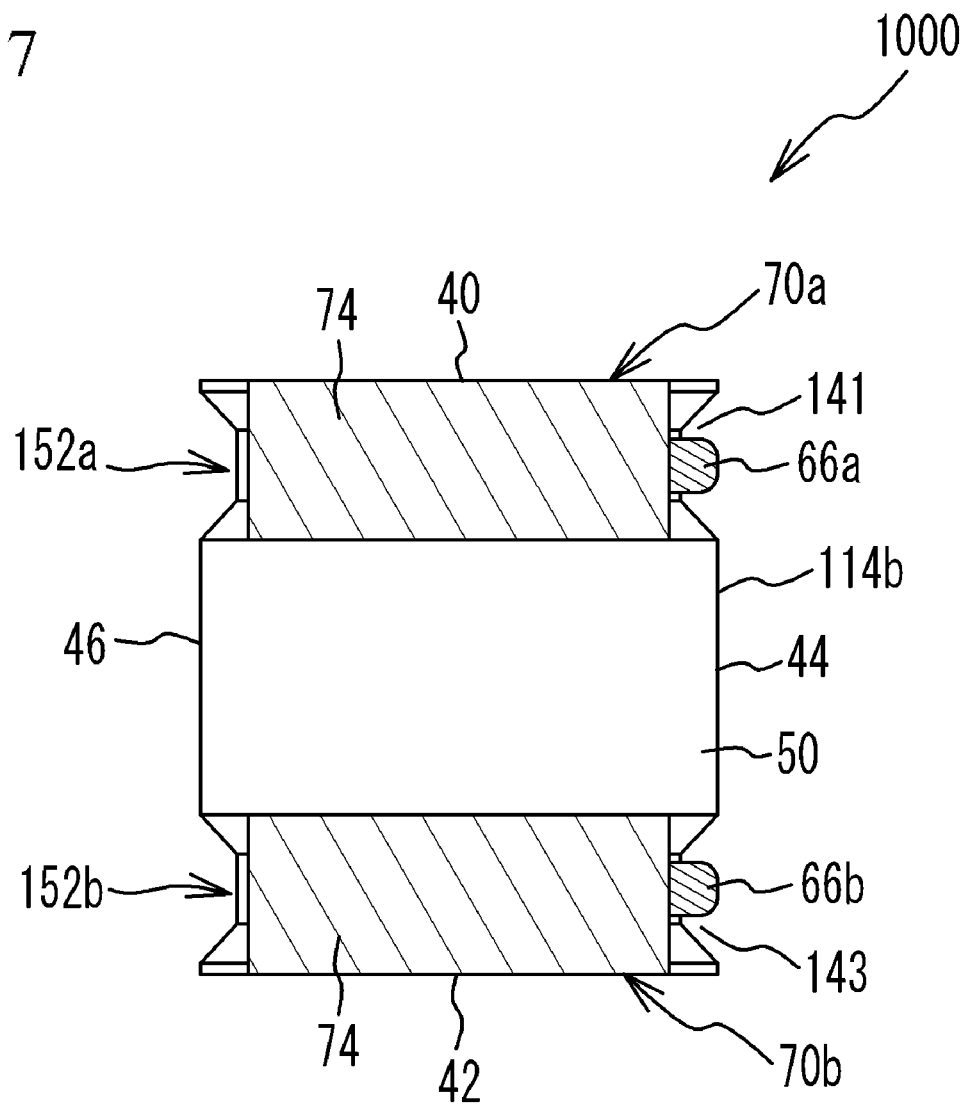
FIG. 7 is a bottom view of the coil component pertaining to the Comparative Example.

FIG. 7 is a bottom view of the coil component pertaining to the Comparative Example. As shown in FIG. 7, the coil component 1000 in the Comparative Example is such that a flange part 114b has two groove parts 152a, 152b on the exterior face 50 in parallel with the short sides of the exterior face 50. The lead part 66a is led into the groove part 152a provided on the exterior face 50, from the side face 44 side on the long side of the exterior face 50 of the flange part 114b, through a cut-out part 141 of the groove part 152a on the side face 44 side. The lead part 66b is led into the groove part 152b provided on the exterior face 50, from the side face 44 side on the long side of the exterior face 50 of the flange part 114b, through a cut-out part 143 of the groove part 152b on the side face 44 side. The end portions of the lead parts 66a, 66b are joined by the solder 74 to the metal films provided in the groove parts 152a, 152b. The remaining constitutions are the same as those in Example 1 and therefore not illustrated or explained.

According to the Comparative Example, both the lead parts 66a, 66b are led into the groove parts 152a, 152b provided on the exterior face 50, from the side face 44 side of the flange part 114b, through the cut-out parts 141, 143 of the groove parts 152a, 152b on the side face 44 side. In this case, application of impact to the coil component 1000 due to dropping, etc., of the circuit board on which the coil component 1000 is mounted, for example, causes the impact force to easily concentrate on the side face 44 side of the flange part 114b where the lead parts 66a, 66b are led out. As a result, the flange part 114b may be damaged due to the impact force concentrating on the side face 44 side of the flange part 114b. Also, concentration of the force on the side face 44 side of the flange part 114b may cause the terminal parts 70a, 70b to separate from the circuit board on the side face 44 side.

According to Example 1, on the other hand, the lead part 66a is fitted into the groove part 52 provided on the exterior face 50, from the side face 40 side of the flange part 14b, through the cut-out part 41 of the groove part 52 on the side face 40 side, while the lead part 66b is fitted into the groove part 52 provided on the exterior face 50, from the side face 42 side of the flange part 14b, through the cut-out part 43 of the groove part 52 on the side face 42 side, as shown in FIG. 2B. This way, application of impact to the coil component 100 due to dropping, etc., of the circuit board on which the coil component 100 is mounted, for example, results in the impact force easily dispersing to the side face 40 side of the flange part 14b where the lead part 66a is led out from the winding part 64, and also to the side face 42 side of the flange part 14b where the lead part 66b is led out from the winding part 64. As a result, damage to the flange part 14b can be prevented. Additionally, separation of the terminal parts 70a, 70b from the circuit board is also prevented, because the impact force is dispersed.

Figure 11:
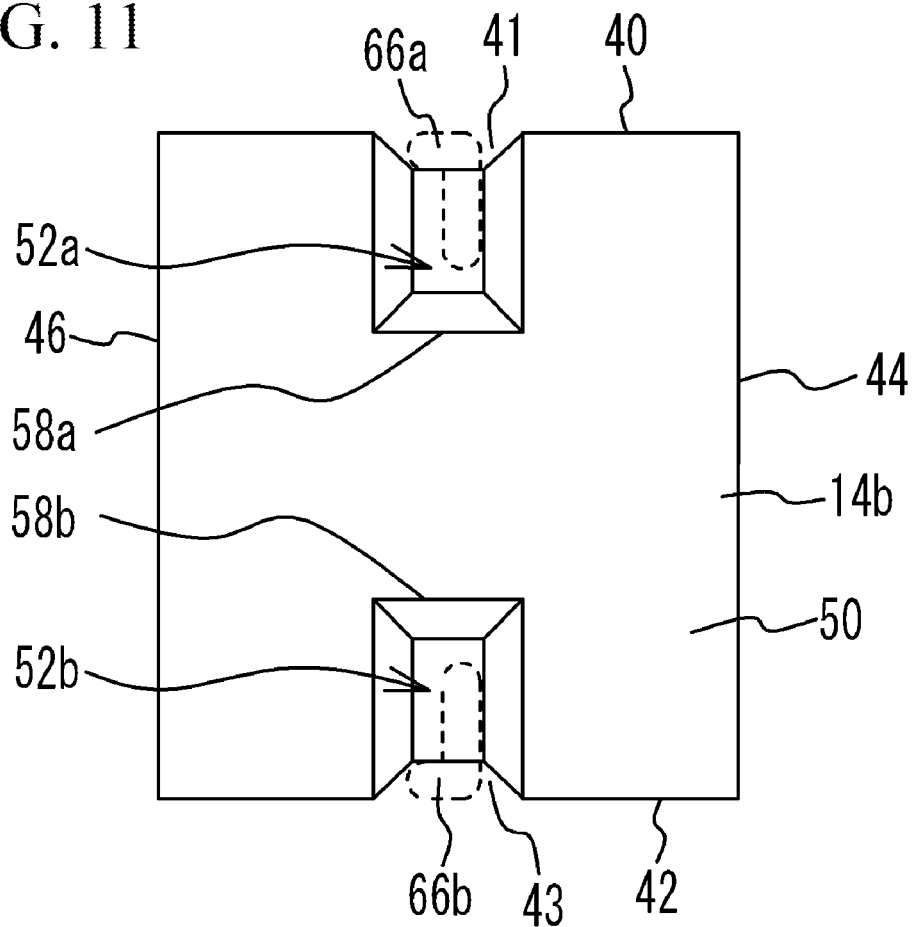
FIG. 11 is a bottom view showing the drum core in Example 3.

The groove part to which the lead part 66a is led in, and the groove part to which the lead part 66b is led in, may represent multiple groove parts as shown in FIG. 11 to be explained later, or they may represent a single groove part 52 as shown in FIG. 3B. By providing a single groove part 52, the region of the flange part 14b in which its thickness would become thin can be reduced, compared to when the groove parts 152a, 152b are provided in parallel as in the Comparative Example (FIG. 7). As a result, drop in the mechanical strength of the flange part 14b can be prevented, and consequently damage to the flange part 14b can be prevented. Also, providing a single groove part 52 facilitates the formation of the drum core 10, while also facilitating the directional regulation of the drum core 10. From the viewpoint of reducing the region of the flange part 14b in which its thickness would become thin, preferably the groove part 52 extends linearly in a direction roughly vertical to the side faces 40, 42 of the flange part 14b. A case where the groove part to which the lead part 66a is led in and the groove part to which the lead part 66b is led in represent multiple groove parts, will be explained under Example 3 presented later.

Figure 8A:
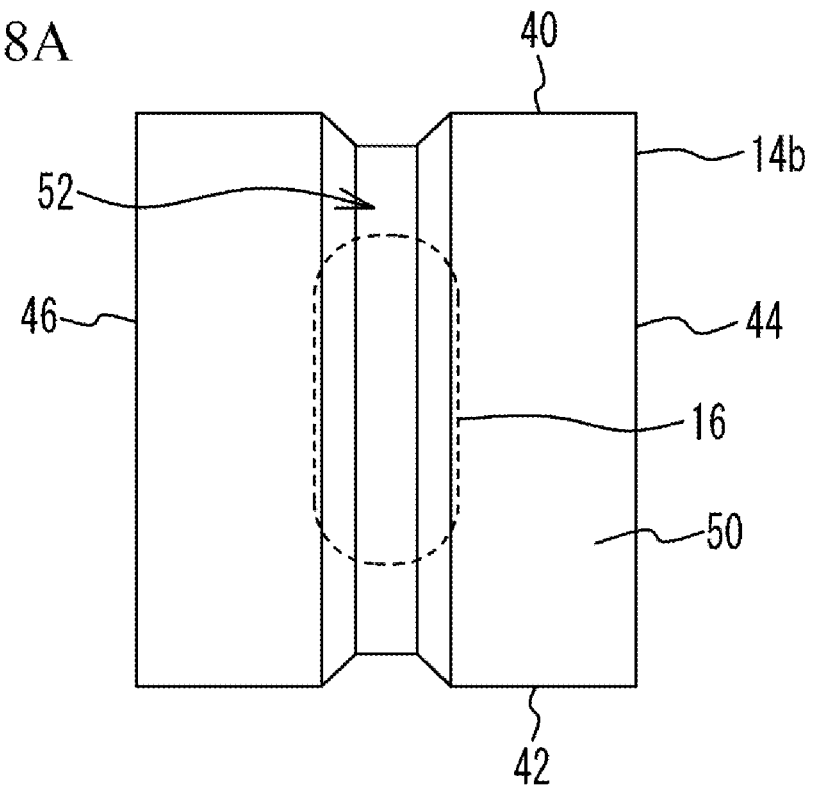
Figure 8B:
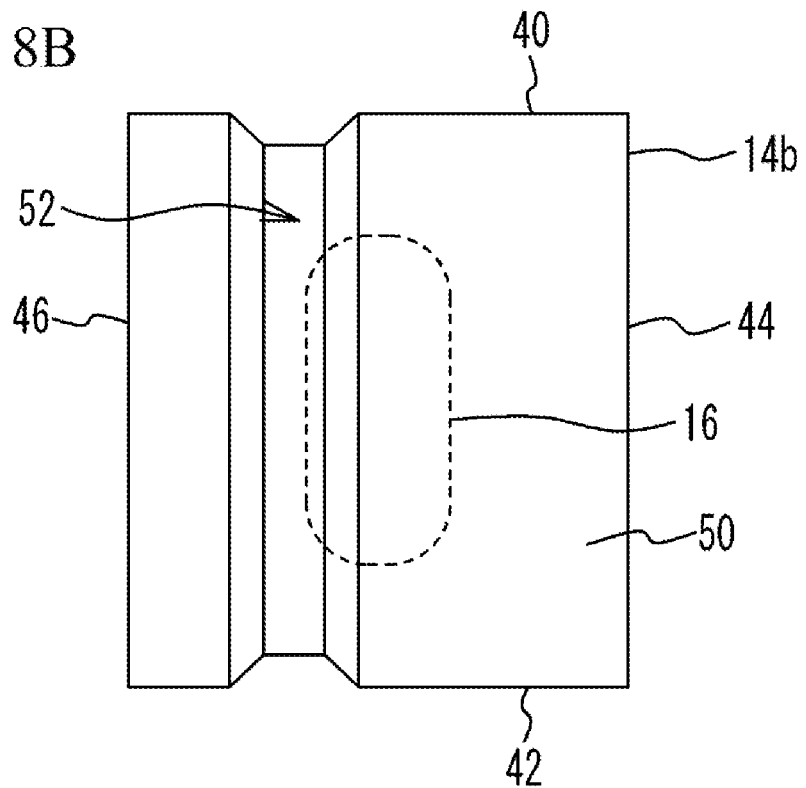
FIG. 8B is a drawing showing the position relationship between the winding shaft and the groove part in Variation Example 1 of Example 1.

FIG. 8A is a drawing showing the position relationship between the winding shaft and the groove part in Example 1, while FIG. 8B is a drawing showing the position relationship between the winding shaft and the groove part in Variation Example 1 of Example 1. In FIGS. 8A and 8B, the region of the winding shaft 12 as projected onto the exterior face 50 of the flange part 14b is illustrated as the projected area 16 encircled by a dotted line. As shown in FIG. 8A, the groove part 52 extends in a manner fitting inside the projected area 16 in the width direction of the groove part 52, in Example 1. In other words, the groove part 52 is provided in a manner fitting inside a position where the entire groove part 52 in the width direction overlaps with the winding shaft 12 when viewed from the exterior face 50 of the flange part 14b. This means that the winding shaft 12 is positioned over the location where the thickness of the flange part 14b has become thin due to the groove part 52, and therefore the region of the flange part 14b in which its mechanical strength would drop can be reduced. As a result, damage to the flange part 14b can be prevented.

As shown in FIG. 8B, the groove part 52 extends in a manner partially positioned inside the projected area 16, in Variation Example 1 of Example 1. In other words, the groove part 52 is provided at a position where it partially overlaps the winding shaft 12 when viewed from the exterior face 50 of the flange part 14b. In this case, too, the region of the flange part 14b in which its mechanical strength would drop can be reduced, and damage to the flange part 14b can be prevented as a result. From the viewpoint of reducing the region of the flange part 14b in which its mechanical strength would drop, the groove part 52 is such that preferably at least one-half of it is positioned inside the projected area 16, or more preferably at least two-thirds of it is positioned inside the projected area 16, or yet more preferably at least three-fourths of it is positioned inside the projected area 16, in the width direction of the groove part 52. Most preferably the groove part 52 extends in a manner entirely fitting inside the projected area 16 in the width direction of the groove part 52, as shown in FIG. 8A.

Example 2

Figure 9A:
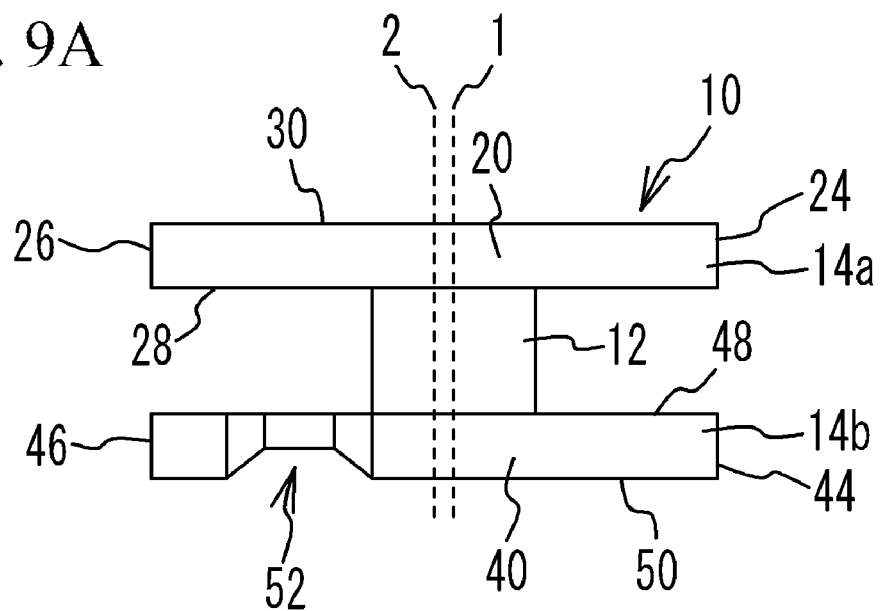
Figure 9B:
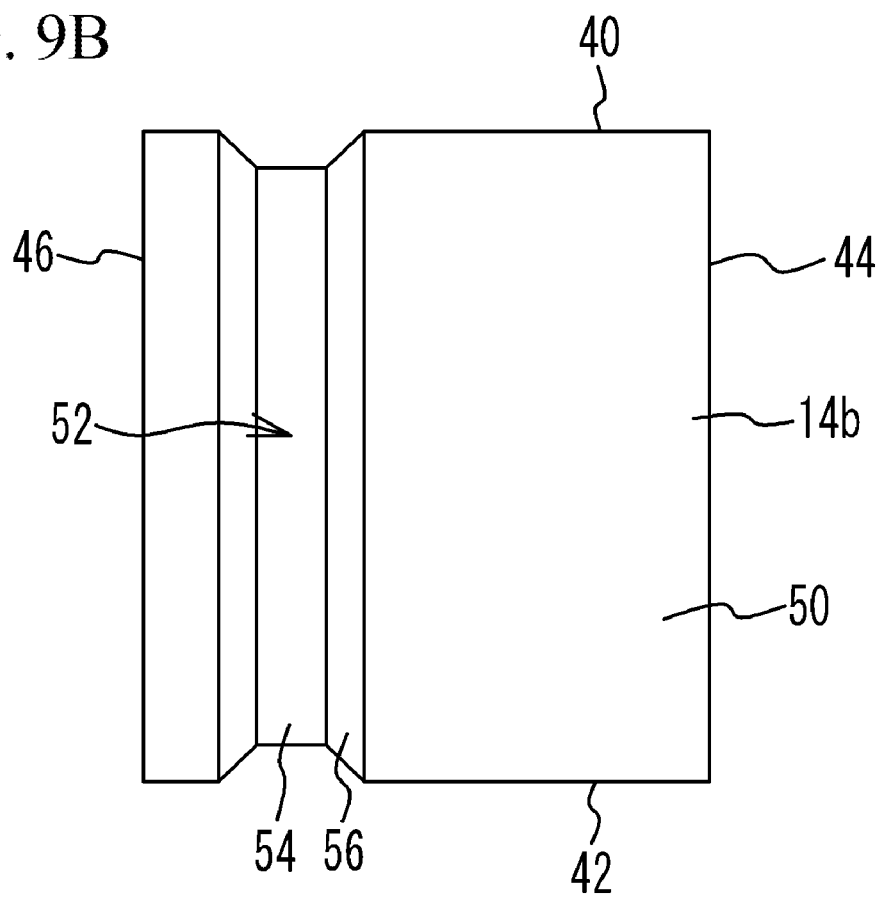
FIG. 9B is a bottom view, showing the drum core in Example 2.

FIG. 9A is a side view, while FIG. 9B is a bottom view, showing the drum core in Example 2. As shown in FIGS. 9A and 9B, the coil component in Example 2 is such that the winding shaft 12 is connected to the interior faces 28, 48 of the flange parts 14a, 14b, with the center axis 1 of the winding shaft 12 offset toward the side face 24, 44 sides from the centers 2 of the exterior faces 30, 50 of the flange parts 14a, 14b. The groove part 52 is provided on the exterior face 50 of the flange part 14b, positioned between the winding shaft 12 and the side face 26 of the flange part 14a and the side face 46 of the flange part 14b. The remaining constitutions of the coil component in Example 2 are the same as those of the coil component in Example 1 and therefore not illustrated or explained. In Example 2, the parts in common with Example 1 can achieve effects similar to those obtained in Example 1.

According to Example 2, the groove part 52 is provided in a manner offset to the direction opposite the one in which the center axis 1 of the winding shaft 12 is offset from the centers of the exterior faces 30, 50 of the flange part 14a, 14b. This makes it easy to lead out the lead parts 66a, 66b from the winding part 64 over a short distance, as explained using FIG. 10B later. As a result, the resistance of the coil part 60 can be lowered and its electrical characteristics can be improved. Furthermore, offsetting of the center axis 1 of the winding shaft 12 and the groove part 52, from the center of the exterior face 50, allows the areas of the flange parts 14a, 14b to be decreased and the size of the coil component to be reduced.

From the viewpoint of leading out the lead parts 66a, 66b from the winding part 64 over a short distance, preferably the winding shaft 12 is such that its center axis is offset from the centers of the exterior faces 30, 50 of the flange parts 14a, 14b by an equivalent of the thickness of the conductive wire 62 forming the coil part 60.

Figure 10A:
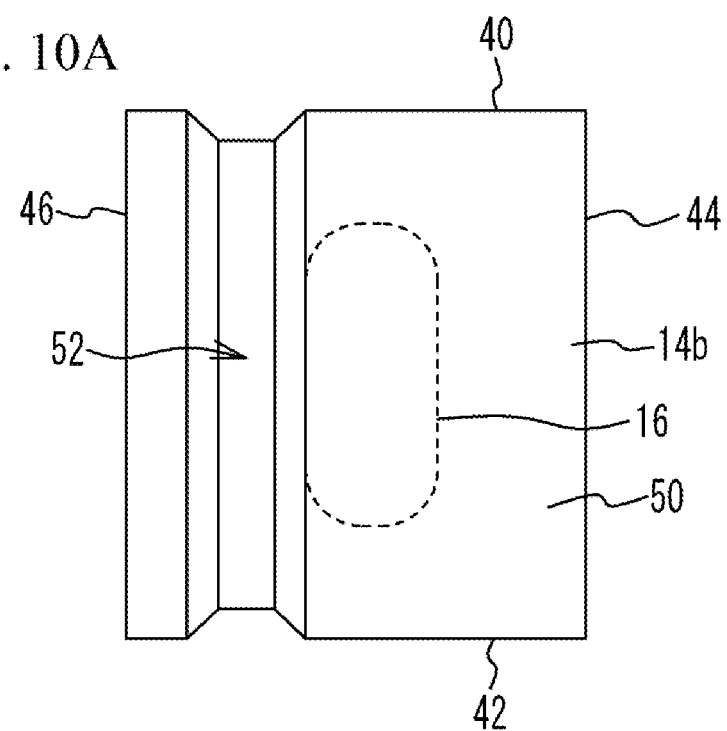
FIGS. 10A and 10B are drawings explaining the relationship between the drum core and the coil part in Variation Example 1 of Example 2.
Figure 10B:
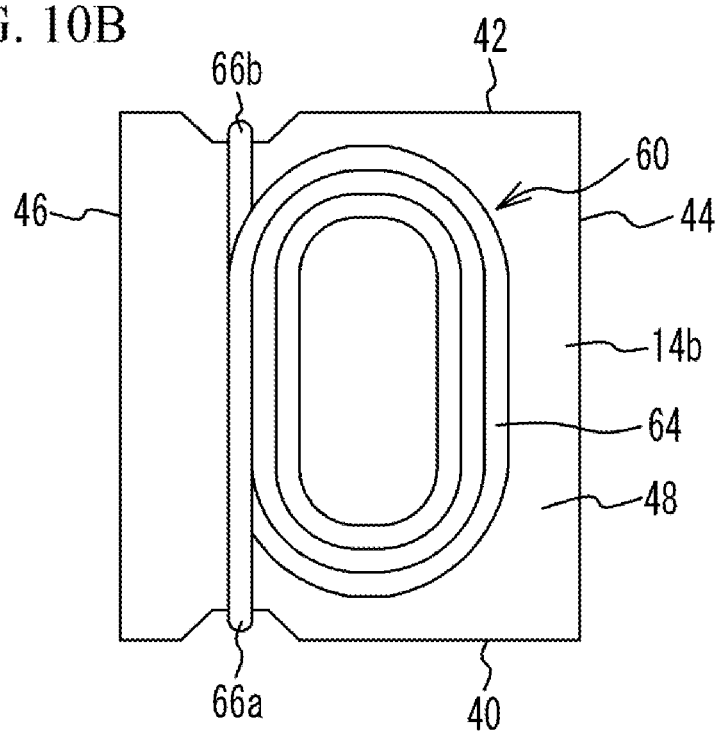

FIGS. 10A and 10B are drawings explaining the relationship between the drum core and the coil part in Variation Example 1 of Example 2. As shown in FIGS. 10A and 10B, the coil component in Variation Example 1 of Example 2 is such that its lead parts 66a, 66b are led out linearly toward the side faces 40, 42, respectively, from the winding part 64 of the coil part 60 being wound around the winding shaft 12.

In the coil component pertaining to Variation Example 1 of Example 2, the groove part 52 is provided in a manner not overlapping the projected area 16 obtained by projecting the winding shaft 12 onto the exterior face 50 of the flange part 14b, as shown in FIG. 10A. This means that, as shown in FIG. 10B, the lead parts 66a, 66b are led out linearly from the winding part 64 toward the side faces 40, 42, respectively, which allows them to be led out to the exterior face 50 of the flange part 14b over a short distance. This decreases the deflections of the lead parts 66a, 66b and reduces winding slack in the winding part 64, which in turn allows for reduction in the variability of inductance. Also, the resistance value of the coil can be reduced. While the example illustrated a case where the groove part 52 does not overlap with the projected area 16, the two may overlap partially so long as the lead parts 66a, 66b can be led out from the winding part 64 over a short distance. In this case, the effect of preventing damage to the flange part 14b can also be achieved, as explained in Example 1.

Example 3

While Examples 1 and 2 illustrated examples where the lead parts 66a, 66b were led out into a single groove part 52, Example 3 explains a case where the lead parts 66a, 66b are led out into two groove parts, each having a cut-out part only on one of the side faces 40, 42. FIG. 11 is a bottom view showing the drum core in Example 3. It should be noted that, in FIG. 11, the lead parts 66a, 66b led out from the winding part 64 are shown by dotted lines. As shown in FIG. 11, the coil component in Example 3 is such that groove parts 52a, 52b, each having a cut-out part 41 or 43 only on one of the side faces 40, 42, are provided on the exterior face 50 of the flange part 14b. The groove part 52a is provided in contact with the side face 40, while the groove part 52b is provided in contact with the side face 42. It should be noted that the side faces 40, 42 may have concaved parts, and the groove parts 52a, 52b may have cut-out parts 41, 43 in these concaved parts. The lead part 66a is led into the groove part 52a from the side face 40 side, from the cut-out part 41 of the groove part 52a on the side face 40 side. The lead part 66b is led into the groove part 52b from the side face 42 side, from the cut-out part 43 of the groove part 52b on the side face 42 side.

The groove parts 52a, 52b are provided in such a way that they are each positioned as an independent, separate groove along a straight line roughly parallel with one side of the exterior face 50. This means that, as illustrated in FIG. 11, the groove part 52a has a cut-out part 41 only on the side face 40, and has a tip portion 58a on the opposite side of the cut-out part 41. The groove part 52b has a cut-out part 43 only on the side face 42, and has a tip portion 58b on the opposite side of the cut-out part 43. The groove parts 52a, 52b may be formed along a straight line, or they may be formed in a manner offset in a direction parallel with the side faces 40, 42. The groove parts 52a, 52b each extend along one side of the exterior face 50. Based on the shapes of general surface mounting components, desirably the groove parts 52a, 52b extend along the long sides of the exterior face 50; depending on the terminal structure, however, the groove parts 52a, 52b may extend along the short sides of the exterior face 50. The remaining constitutions of the coil component in Example 3 are the same as those of the coil component in Example 1 and therefore not illustrated or explained. In Example 3, the parts in common with Example 1 can achieve effects similar to those obtained in Example 1.

According to Example 3, the groove part 52a into which the lead part 66a is led out, and the groove part 52b into which the lead part 66b is led out, are separate groove parts, each having a cut-out part 41 or 43 only on one of the side faces 40, 42. In this case, too, the impact force is easily dispersed and therefore damage to the flange part 14b can be prevented, just like in Example 1. Also, separation of the terminal parts 70a, 70b from the circuit board can be prevented. Furthermore, shorting between the terminals 70a, 70b can be prevented, because the grooves 52a, 52b are separate groove parts, each having a cut-out part 41 or 43 only on one of the side faces 40, 42. In other words, special countermeasures to prevent shorting between the terminal parts 70a, 70b are no longer necessary.

Preferably the grooves 52a, 52b are provided at positions along a straight line. This way, the regions of the exterior face 50 in which the groove parts 52*a*, 52*b* are formed become smaller, compared to when the groove parts 52*a*, 52*b* are not formed along a straight line, and consequently drop in the mechanical strength of the flange part 14*b* can be prevented. Also, forming the groove parts 52*a*, 52*b* in closer symmetry over the center line of the exterior face 50 of the flange part 14*b*, becomes easy, which in turn makes it easy to prevent drop in the mechanical strength of the flange part 14*b*.

Figure 12A:
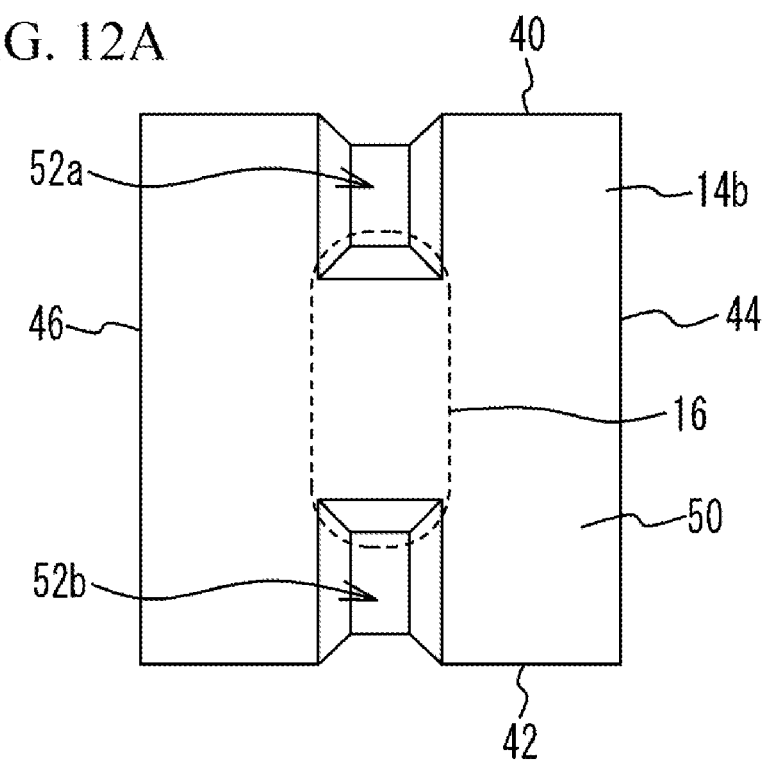
Figure 12B:
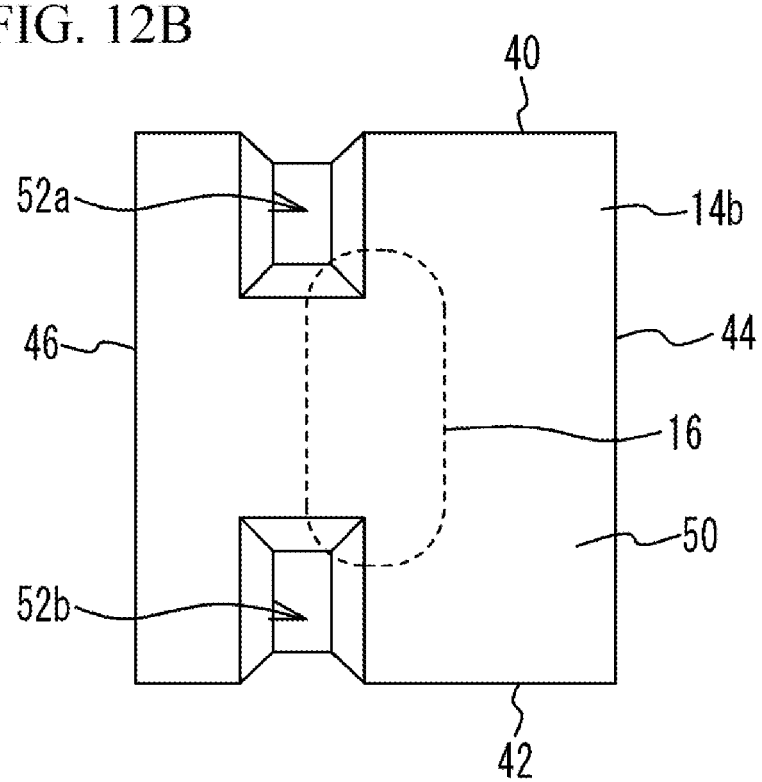
FIG. 12B is a drawing showing the position relationship between the winding shaft and the groove parts in Variation Example 1 of Example 3.

FIG. 12A is a drawing showing the position relationship between the winding shaft and the groove parts in Example 3, while FIG. 12B is a drawing showing the position relationship between the winding shaft and the groove parts in Variation Example 1 of Example 3. As shown in FIG. 12A, the groove parts 52*a*, 52*b* in Example 3 are provided in a manner fitting inside the projected area 16 in the width direction of the groove parts 52*a*, 52*b*, just like in FIG. 8A pertaining to Example 1. In other words, the groove parts 52*a*, 52*b* are provided in a manner fitting inside positions where the entire groove parts 52*a*, 52*b* in the width direction overlap the winding shaft 12 when viewed from the exterior face 50 of the flange part 14*b*. As shown in FIG. 12B, the groove parts 52*a*, 52*b* in Variation Example 1 of Example 3 are provided in a manner positioned partially inside the projected area 16, just like in FIG. 8B pertaining to Variation Example 1 of Example 1. In other words, the groove parts 52*a*, 52*b* are provided at positions where they partially overlap the winding shaft 12 when viewed from the exterior face 50 of the flange part 14*b*. As a result, the regions of the flange part 14*b* in which its mechanical strength would drop can be reduced, and consequently damage to the flange part 14*b* can be prevented, as explained in Example 1.

It should be noted that, while FIG. 12A illustrated an example where both of the grooves 52*a*, 52*b* were provided in a manner fitting inside the projected area 16 in the width direction, it may be such that at least one of the groove parts 52*a*, 52*b* is provided in a manner fitting inside a position where the entire groove part 52*a* or 52*b* in the width direction overlaps with the winding shaft 12 when viewed from the exterior face 50 of the flange part 14*b*. Similarly, while FIG. 12B illustrated an example where both of the grooves 52*a*, 52*b* were provided in a manner positioned partially inside the projected area 16, it may be such that at least one of the groove parts 52*a*, 52*b* is provided at a position where it partially overlaps the winding shaft 12 when viewed from the exterior face 50 of the flange part 14*b*. Furthermore, the structure in Example 3 may also be changed to one where the lead parts 66*a*, 66*b* are led out linearly toward the side faces 40, 42, respectively, from the winding part 64 of the coil part 60 being wound around the winding shaft 12, just like in Example 2. This structure makes it possible to lead out the lead parts 66*a*, 66*b* from the winding part 64 to the exterior face 50 of the flange part 14*b* over a short distance. This decreases the deflections of the lead parts 66*a*, 66*b* and reduces winding slack in the winding part 64, which in turn allows for reduction in the variability of inductance. Also, resistance value of the coil can be reduced.

While Example 3 illustrated an example where the groove parts 52*a*, 52*b* were formed along a straight line, this is not the only case. FIG. 13 is a drawing showing another example of layout of two groove parts. As shown in FIG. 13, the two groove parts 52*a*, 52*b* may be formed in a manner offset in directions parallel with the side faces 40, 42. The tip portion 58*a* of the groove part 52*a*, and the tip portion 58*b* of the groove part 52*b*, may not be facing each other or may be partially facing each other. It should be noted that, while Examples 1 to 3 illustrated examples where one or two groove parts were provided on the exterior face 50 of the flange part 14*b*, multiple groove parts of three or more may be provided instead.

Example 4

Figure 14:
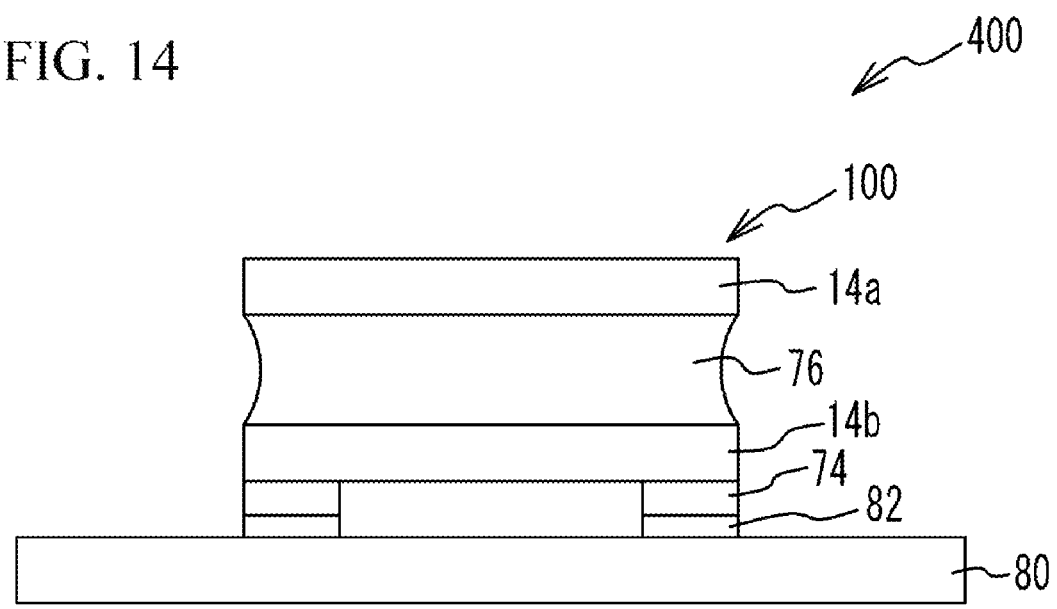
FIG. 14 is a cross-sectional view of the electronic device pertaining to Example 4.

FIG. 14 is a cross-sectional view of the electronic device pertaining to Example 4. As shown in FIG. 14, the electronic device 400 in Example 4 comprises a circuit board 80 and the coil component 100 in Example 1 that has been mounted on the circuit board 80. The coil component 100 is mounted on the circuit board 80 with the solder 74 joined to land pattern electrodes 82 on the circuit board 80.

According to the electronic device 400 in Example 4, the coil component 100 in Example 1 is mounted on the circuit board 80. This way, an electronic device 400 having a coil component 100 with improved impact durability can be obtained. Also, a circuit board 80 of lower height can be obtained by combining it with the coil component 100, which allows for reduction in the dimensions of the electronic device 400. It should be noted that, while Example 4 illustrated an example where the coil component 100 in Example 1 was mounted on a circuit board 80, any of the coil components in Variation Example 1 of Example 1 to Variation Example 1 of Example 3 may be mounted instead.

The foregoing described the examples of the present invention in detail; however, the present invention is not limited to these specific examples and various modifications and changes may be added so long as doing so does not deviate from the key points of the present invention as described in "What Is Claimed Is."

We claim:

1. A coil component comprising: a core part including: a winding shaft; and a flange part provided on an axial-direction end of the winding shaft, wherein the flange part has: an exterior face on an opposite side of the winding shaft, a pair of a first side face and a second side face that are adjoining the exterior face and located opposite to each other, and first and second groove parts provided on the exterior face, which are isolated from each other or connected to each other on the exterior face, wherein the first and second groove parts extend to the first side face and the second side face, respectively, via a cut-out part provided on each of the first side face and the second side face; a coil part including: a winding part constituted by a conductor with an insulating film, which is wound around the winding shaft; and a pair of lead parts that are portions of the conductor led out from the winding part; and a pair of terminal parts formed on the exterior face of the flange part; wherein one of the pair of lead parts is led in from the cut-out part on the first side face of the flange part and fitted inside the first groove part provided on the exterior face, and included in one of the pair of terminal parts; and another of the pair of lead parts is led in from the cut-out part on the second side face of the flange part and fitted inside the second groove part provided on the exterior face, and included in another of the pair of terminal parts, wherein the first and second groove parts are connected to each other on the exterior face and represent one groove part having the cut-out parts on the first side face and the second side face, respectively.

2. The coil component according to claim 1, wherein the first and second groove parts are isolated from each other on the exterior face and represent two groove parts, each having the cut-out part on either the first side face or the second side face.

3. The coil component according to claim 2, wherein the two groove parts are aligned along one straight line roughly parallel with one side of the exterior face as viewed toward the exterior face in the axial direction of the winding shaft.

4. The coil component according to claim 1, wherein the first and second groove parts are provided at positions where the first and second groove parts partially overlap the winding shaft as viewed toward the exterior face in the axial direction of the winding shaft.

5. The coil component according to claim 4, wherein the first and second groove parts are provided in a manner fitting inside positions entirely overlapping the winding shaft in a width direction of the first and second groove parts as viewed toward the exterior face in the axial direction of the winding shaft.

6. The coil component according to claim 1, wherein: the winding shaft is provided in a manner that a center axis of the winding shaft is offset from a center of the exterior face; and the first and second groove parts are provided in a manner offset in a direction opposite to a direction in which the center axis is offset from the center of the exterior face.

7. An electronic device comprising: the coil component of claim 1; and a circuit board on which the coil component is mounted.

\* \* \* \* \*